(12) United States Patent
Grose et al.

(10) Patent No.: US 7,315,971 B2
(45) Date of Patent: Jan. 1, 2008

(54) SYSTEMS AND METHODS FOR IMPROVED MEMORY SCAN TESTABILITY

(75) Inventors: William E. Grose, Plano, TX (US); Lonnie L. Lambert, Plano, TX (US); Jeanne Krayer Pitz, Richardson, TX (US); Toru Tanaka, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 54 days.

(21) Appl. No.: 11/243,898

(22) Filed: Oct. 4, 2005

(65) Prior Publication Data

US 2007/0168776 A1    Jul. 19, 2007

(51) Int. Cl.
*G11C 29/00*    (2006.01)

(52) U.S. Cl. .................................................. 714/718

(58) Field of Classification Search ................ 714/724, 714/727
See application file for complete search history.

(56) References Cited

U.S. PATENT DOCUMENTS

| | | | |
|---|---|---|---|
| 6,691,269 B2 * | 2/2004 | Sunter | 714/727 |
| 6,959,409 B2 * | 10/2005 | AbdEl-Wahid | 714/740 |
| 2005/0080581 A1 * | 4/2005 | Zimmerman et al. | 702/117 |

* cited by examiner

*Primary Examiner*—James C. Kerveros
(74) *Attorney, Agent, or Firm*—William B Kempler; W. James Brady, III; Frederick J. Telecky, Jr.

(57) ABSTRACT

A method and system for testing a device that includes both a digital and analog portion. The digital portion includes a plurality of latch devices, and the analog portion includes a plurality of memory cells and a plurality of selector devices. A selector input controls each of the plurality of selector devices, which is electrically coupled to a respective one of the memory cells, and is indirectly coupled to one of the plurality of latch devices. A load clock loads a pattern into the plurality of latch devices. A derivative of the pattern is received by the plurality of selectors and returned to the plurality of latch devices with the assertion of the selector input. A system clock loads the derivative of the pattern into the plurality of latch devices.

14 Claims, 4 Drawing Sheets

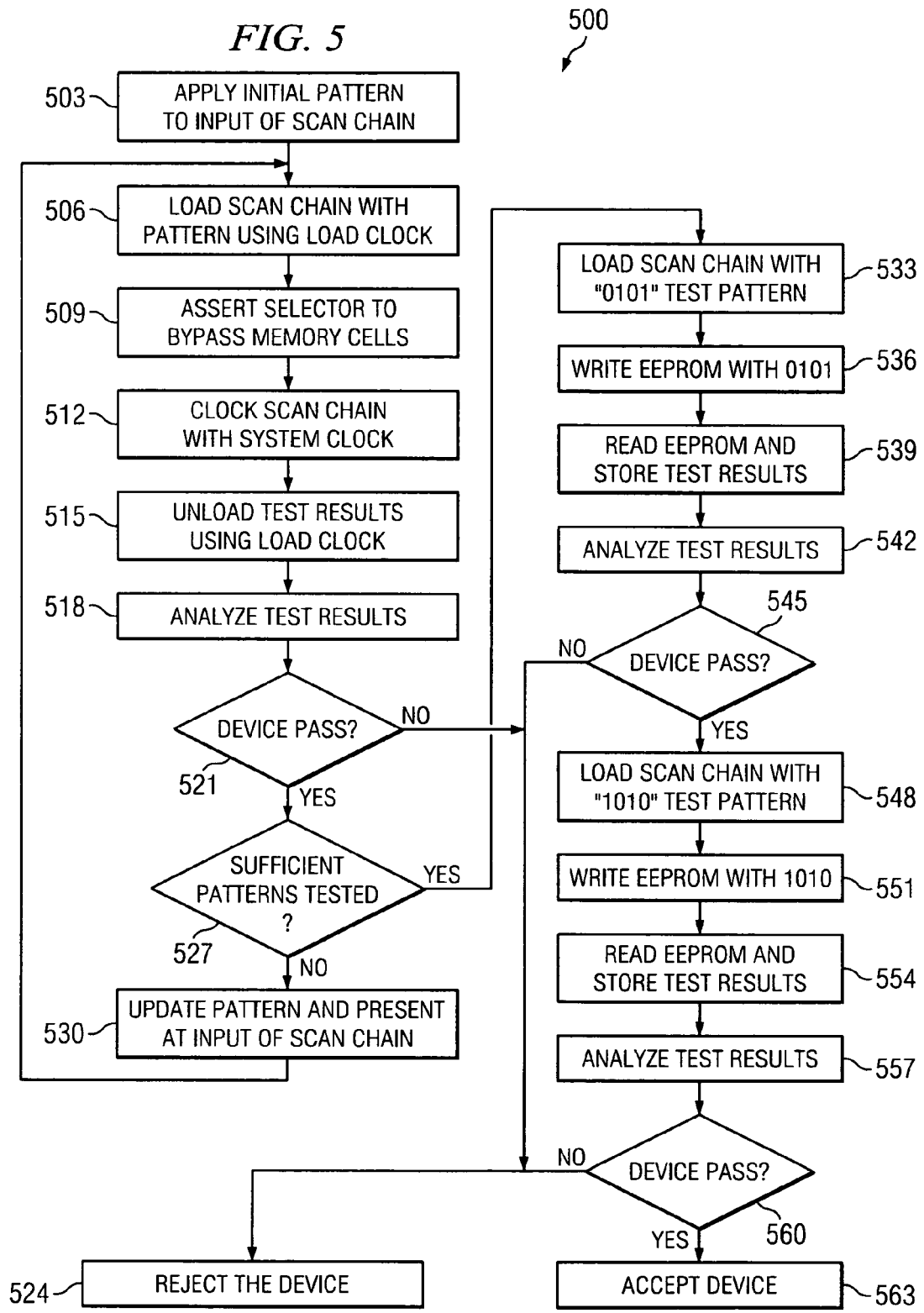

SYSTEMS AND METHODS FOR IMPROVED MEMORY SCAN TESTABILITY

BACKGROUND OF THE INVENTION

The present invention is related to systems and methods for semiconductor device testing, and in particular to systems and methods for efficient testing of semiconductor devices that include memory cells.

Various semiconductor devices have been developed that include an EEPROM disposed along with a digital core on a common semiconductor die. FIG. 1 illustrates one such device 100 with a digital core 110 and an EEPROM 120. Digital core 110 is connected to EEPROM 120 via a series of input and output data lines. The input data lines are bi0-bi3, and allow data to be written from digital core 110 to respective EEPROM cells 121 within to EEPROM 120. The output data lines are bo0-bo3, and allow data to be read from respective EEPROM cells 121 within EEPROM 120.

A typical test of device 100 involves writing EEPROM with alternating patterns using data input lines bi0-bi3, and then reading the alternating patterns via data output lines bo0-bo3. The read pattern is compared against the written pattern to determine if there is a short or open associated with input data lines bi0-bi3 or output data lines bo0-bo3, and if respective EEPROM cells 121 are operating properly. An EEPROM write and an EEPROM read may require a substantial amount of time relative to the clock rate of device 100. Thus, completing a full test of device 100 can take a considerable amount of time, and the time required to test the device may be substantially governed by the EEPROM read and/or write time. Further, the amount of time spent testing a single device is multiplied across potentially millions of devices that need to be tested. Thus, the aforementioned approach to device testing is often both costly and inefficient.

Hence, for at least the aforementioned reason, there exists a need in the art for alternative systems and methods for testing various circuitry.

BRIEF SUMMARY OF THE INVENTION

The present invention is related to systems and methods for semiconductor device testing, and in particular to systems and methods for efficient testing of semiconductor devices that include memory cells.

Some embodiments of the present invention provide methods for testing devices that include memory cells. The methods include providing a device with both analog and digital portions. In such cases, the digital portion includes a plurality of latch devices, and the analog portion includes a plurality of memory cells and a plurality of selector devices. Each of the plurality of selector devices is electrically coupled to a respective one of the memory cells, is at least indirectly coupled to one of the plurality of latch devices, and is controlled by a selector input. A load clock is applied to the plurality of latch devices such that a pattern is loaded into the plurality of latch devices. The selector input is asserted such that a derivative of the pattern is received by the plurality of selectors and returned to at least a subset of the plurality of latch devices. A system clock is applied to the plurality of latch devices such that the derivative of the pattern is loaded into the plurality of latch devices. In one particular case, the memory cells are EEPROM cells, while in other cases they are different types of memory cells. In some cases, the selector devices are multiplexers (hereinafter "mux" or "muxes"). In various cases, the methods further include application of the load clock to the plurality of latch devices such that the derivative of the pattern is provided by the latched devices to a output.

In various cases of the methods, the plurality of latch devices are formed in a scan chain. In such cases, applying the load clock to the plurality of latch devices such that the pattern is loaded into the plurality of latch devices may include providing multiple cycles of the load clock to the scan chain. In such cases, the methods may further include applying the load clock to the plurality of latch devices in the scan chain such that the derivative of the pattern is provided by the plurality of latch devices to the output. Where the scan chain is serially loaded and unloaded, this process may involve several cycles of the load clock. When implemented as a scan chain, the scan chain may be shifted serially to load and/or unload a pattern. In various cases, the system clock is applied to the plurality of latch devices when the selector input is at one level, and the load clock is applied to the plurality of latch devices when the selector input is at another level. Thus, as just one example, the system clock is applied to the plurality of latch devices when the test selector is asserted high, and the load clock is applied when the selector input is asserted low.

In some cases, the methods further include applying the load clock to the plurality of latch devices such that another pattern is loaded into the plurality of latch devices, and the selector input is driven such that a derivative of the pattern is written to at least a portion of the memory cells. In addition, the system clock is applied to the plurality of latch devices such that a derivative of the other pattern is loaded from the portion of the memory cells to the plurality of latch devices.

Other embodiments of the present invention provide systems for facilitating efficient semiconductor device testing. Such systems include a mixed signal device with an analog portion and a digital portion. The analog portion includes a plurality of memory cells that are each associated with a respective selector device. In some cases, such selector devices are muxes. The memory cells and the associated selector devices are accessible via the digital portion, and the selector devices are operable to bypass the associated memory cells. The digital portion includes a plurality of latch devices coupled to one or more of the selector devices. In some cases, the plurality of latch devices are formed in a scan chain which can be loaded with a pattern using a load clock. After such loading occurs, a derivative of the pattern may be latched from the plurality of selector devices using a system clock. In various cases, the digital portion is clocked using a system clock and the selector devices are muxes controlled via a selector input. In such cases, data provided to the mux from the digital portion may be returned to the digital portion within a cycle of the system clock when the selector input is at a particular level. In some cases, data provided to the mux from the digital portion is written to the associated memory cell when the selector input is at another level.

Yet other embodiments of the present invention provide test enabled mixed signal devices. Such devices include a digital core and an analog memory. The digital core includes a plurality of latch devices formed in a scan chain, and loadable using either a system clock or a load clock. The analog memory includes a plurality of memory cells and a plurality of muxes. Each of the plurality of muxes is controlled by a selector input, electrically coupled to a respective one of the memory cells, and at least indirectly coupled to one of the plurality of latch devices. Upon assertion of the selector input, data is provided to the plurality of muxes from the digital core and returned to the digital core from the muxes without necessarily being written to the associated memory cells. The memory cells may be, for example, EEPROM and EPROM cells.

This summary provides only a general outline of some embodiments of the present invention. Many other objects, features, advantages and other embodiments of the present invention will become more fully apparent from the following detailed description, the appended claims and the accompanying drawings.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

FIG. 5 is a flow diagram illustrating test methods in accordance with one or more embodiments of the present invention.

DETAILED DESCRIPTION OF THE INVENTION

Figure 1:
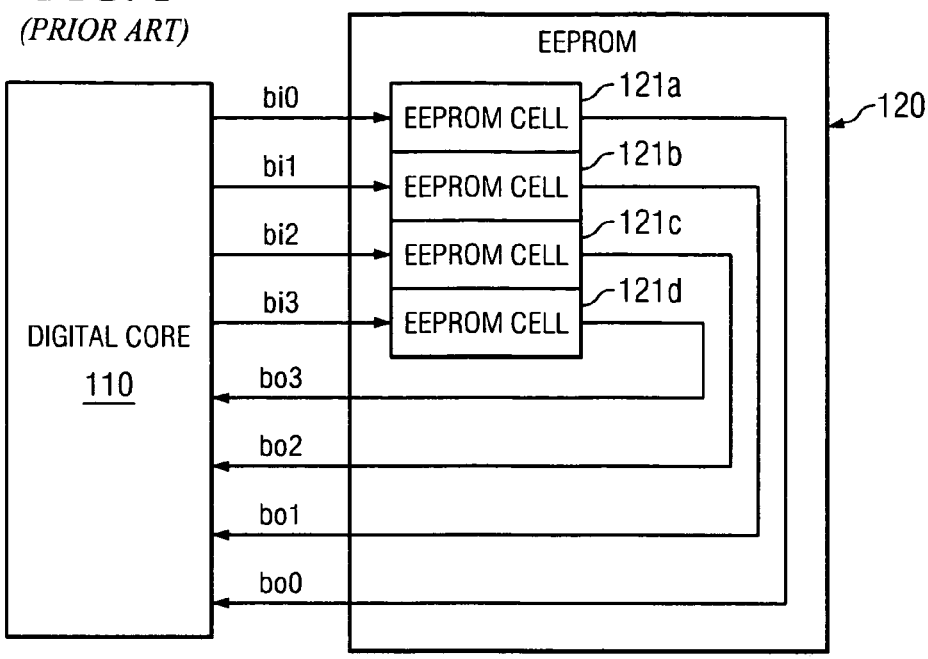
FIG. 1 is a schematic view of an existing mixed signal device with a digital core and an EEPROM.

The present invention is related to systems and methods for semiconductor device testing, and in particular to systems and methods for efficient testing of semiconductor devices that include memory cells.

Some embodiments of the present invention provide systems for facilitating efficient semiconductor device testing. Such systems may include a mixed signal device. As used herein, the term "mixed signal device" is used in its broadest sense to mean any semiconductor device that incorporates different signaling approaches. Thus, as an example, a mixed signal device may include both a digital portion and an analog portion. Based on the disclosure provided herein, one of ordinary skill in the art will recognize a variety of mixed signal devices that may be augmented using embodiments of the present invention. The analog portion may include a plurality of memory cells that are each associated with a respective selector device. As used herein, the term "memory cell" is used in its broadest sense to mean any semiconductor device and/or circuit capable of storing information. Thus, as just some examples, a memory cell may be an EEPROM cell, an EPROM cell, a flash memory cell, a DRAM cell, or an SDRAM cell. Based on the disclosure provided herein, one of ordinary skill in the art will recognize a variety of memory cells that may be used in relation to one or more embodiments of the present invention. Also, as used herein, the term "selector device" is used in its broadest sense to mean any semiconductor device and/or circuit capable of diverting a signal path. Thus, for example, a selector device may be a multiplexer or mux. Based on the disclosure provided herein, one of ordinary skill in the art may recognize other devices and/or circuits that would operate as selector devices in accordance with one or more embodiments of the present invention. Also, as used herein, the phrase "at least a subset of the plurality of latches" means any number of the latches from none of the plurality of latches up to all of the plurality of latches.

In the systems according to the aforementioned embodiment, the memory cells and the associated selector devices are accessible via the digital portion, and the selector devices are operable to bypass associated memory cells. The digital portion includes a plurality of latch devices coupled to one or more of the selector devices. As use herein, the term "latch device" is used in its broadest sense to mean any semiconductor device and/or circuit capable of storing information based on a clock input. Thus, for example, a latch device may be any type of flip-flop or other similar device. Based on the disclosure provided herein, one of ordinary skill in the art may recognize other devices and/or circuits that would operate as latch devices in accordance with one or more embodiments of the present invention.

In some cases, the latch devices are formed in a scan chain. As such, latch devices used for implementing the normal operational mode of a device can be re-used for implementing a test procedure. In such cases, the scan chain may be loaded with a number of patterns using a load clock. The loaded pattern may then propagate through the various circuitry. Using a system clock, a derivative of the pattern may be stored in the same latch devices. The scan chain may then be clocked using the load clock to unload the derivative pattern to a test output. As used herein, the term "derivative" when modifying the term "pattern" is used in its broadest sense to mean either an original pattern, or some modified version of the original pattern. Thus, for example, an element of an original pattern may be loaded into a latched device. In turn, that element of the pattern may be provided directly to a selector device and returned by the selector device to a latch device. In this case, the element of the pattern is directly returned without modification, but is referred to as a "derivative" of the pattern. In contrast, the element of an original pattern may be loaded into a latched device, passed through a variety of logic which may modify the level of the element, and the modified element may then be returned to a latch device. In this case, the pattern is returned in a modified condition, but is similarly referred to as a "derivative" of the pattern.

Where a scan chain is employed, it may provide an advantage of allowing an extensive test procedure without substantially increasing required semiconductor area. In one particular case, it is possible to load the scan chain using the load clock, and shortly thereafter clock the scan chain with the system clock to capture data signals provided by the selectors. In one case, data can be provided by the scan chain to the selectors upon application of a load clock, and the corresponding data from the selectors clocked back into the scan chain upon application of the system clock within one cycle of the system clock. This provides an ability to test interconnections between the analog portion and the digital portion without incurring an often significant time penalty required to write and/or read the memory cells. As such, more extensive testing may become practical, and the testing may require significantly less time.

One particular embodiment of the present invention provides a method for implementing a testable device. Implementing the method may include using design techniques and tools known in the art for designing semiconductor devices. The methods may specifically include designing a digital portion and an analog portion of a device. The digital portion includes a plurality of latch devices that are loadable based on both a system clock and a load clock and formed in a scan chain. The analog portion includes a number of memory cells and muxes with at least some of the muxes being electrically coupled to a respective one of the memory cells. Such muxes are at least indirectly coupled to one of the latch devices and are controlled by a selector input. Circuitry is designed to control the assertion of the selector input such that upon assertion of the selector input, data is provided to the muxes from the digital portion and returned to the digital portion from the muxes.

Figure 2:
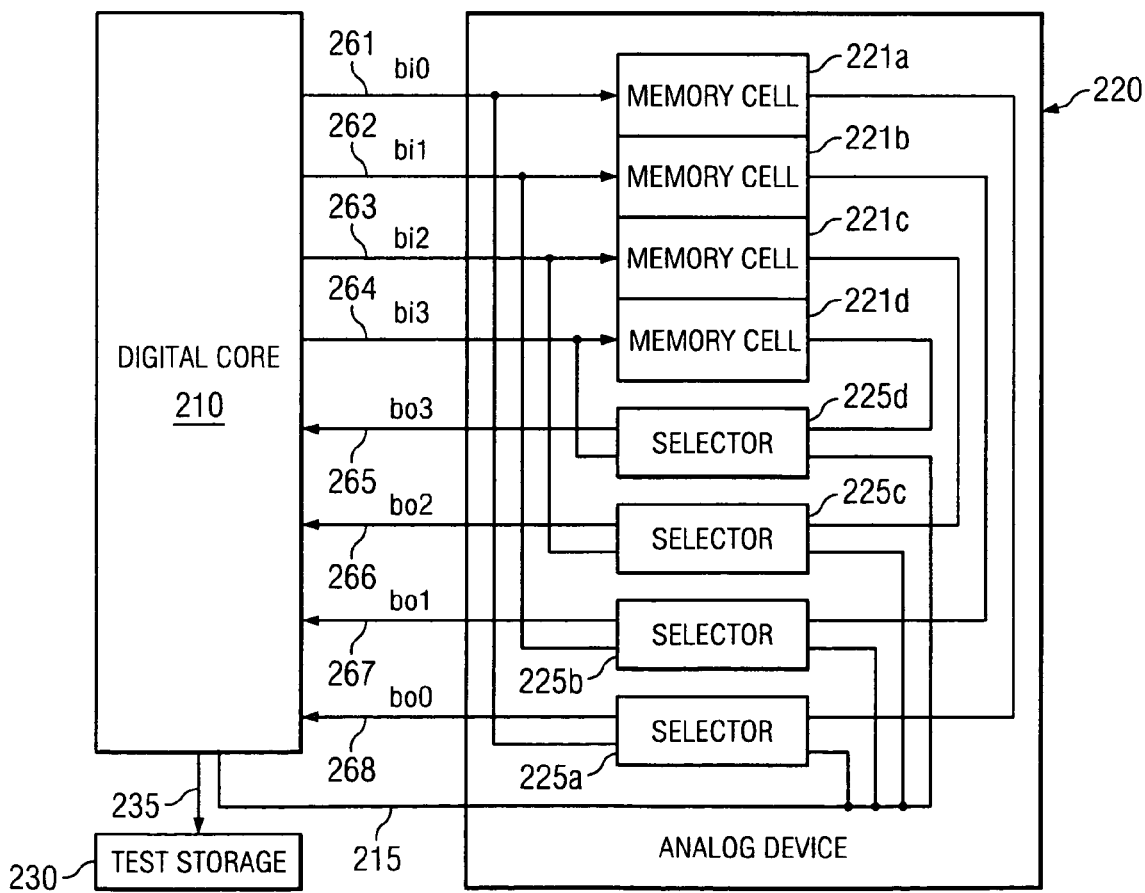
FIG. 2 is a schematic view of a mixed signal system designed for improved testability in accordance with some embodiments of the present invention.

Turning to FIG. 2, a system 200 in accordance with various embodiments of the present invention is illustrated. System 200 includes a digital core 210, an analog device 220, and a test storage 230. Digital core 210 is connected to analog device 220 via a series of input data lines 261, 262, 263, 264, and a series of output lines 265, 266, 267, 268. In addition, a selector input 215 is provided between digital core 210 and analog device 220. Analog device 220 includes a number of memory cells 221 each associated with respective selector devices 225. The input data lines allow data to be written from digital core 210 to respective memory cells 221 within analog device 220. The output data lines allow data to be read from respective memory cells 221 within analog device 220. Selectors 225 allow data to bypass the associated memory cells 221. Thus, for example, where selector input 215 is provided at one level, data provided on input line 261 is provided onto output line 268 by way of selector 225a, and without necessarily passing though memory cell 221a. Alternatively, where selector input 215 is provided at another level, data provided on input line 261 is written to memory cell 221a, and output line 268 reflects the written value on a later read of memory cell 221a. The other selectors 225 act similarly in relation to the respective input lines, output lines and memory cells. In some cases, analog device 220 is an EEPROM, and memory cells 221 are EEPROM cells.

In operation, selector input 215 can be asserted such that memory cells 221 are bypassed, and data on input lines 261, 262, 263, and 264 is reflected after some minimal propagation delay on data output lines 268, 267, 266 and 265. In some cases, selectors 225 are muxes. In such cases, the muxes include two inputs: one from the output of the associated memory cell 221, and the other from a respective one of input lines 261, 262, 263, 264. The output from the mux is a respective one of output lines 265, 266, 267, 268. Based on selector input 215, either the output from the associated memory cell 221 or the respective input line 261, 262, 263, or 264 drives the associated output line 265, 266, 267, or 268.

Data received from analog device 220, whether it be the data from input lines 261, 262, 263, 264, or data from memory cells 221 is received by digital core 210 via output lines 265, 266, 267, 268. This data is stored by latching devices within digital core 210, and then transferred to a test storage 230 via an interface 235. In one particular case, interface 235 is a serial interface. Test storage 230 may be any device capable of receiving information via interface 235, and at least temporarily storing the received data. In at least some cases, digital core 210 and analog device 220 are is implemented on a common semiconductor die device that is distinct from test storage 230. In one particular case, test storage 230 is a memory device implemented as part of a test fixture. The test fixture may be tailored for testing a semiconductor device including one or both of digital core 210 and analog device 220. Data maintained in test storage 230 may be compared against expected results to determine whether the tested semiconductor device passed or failed.

Figure 3:
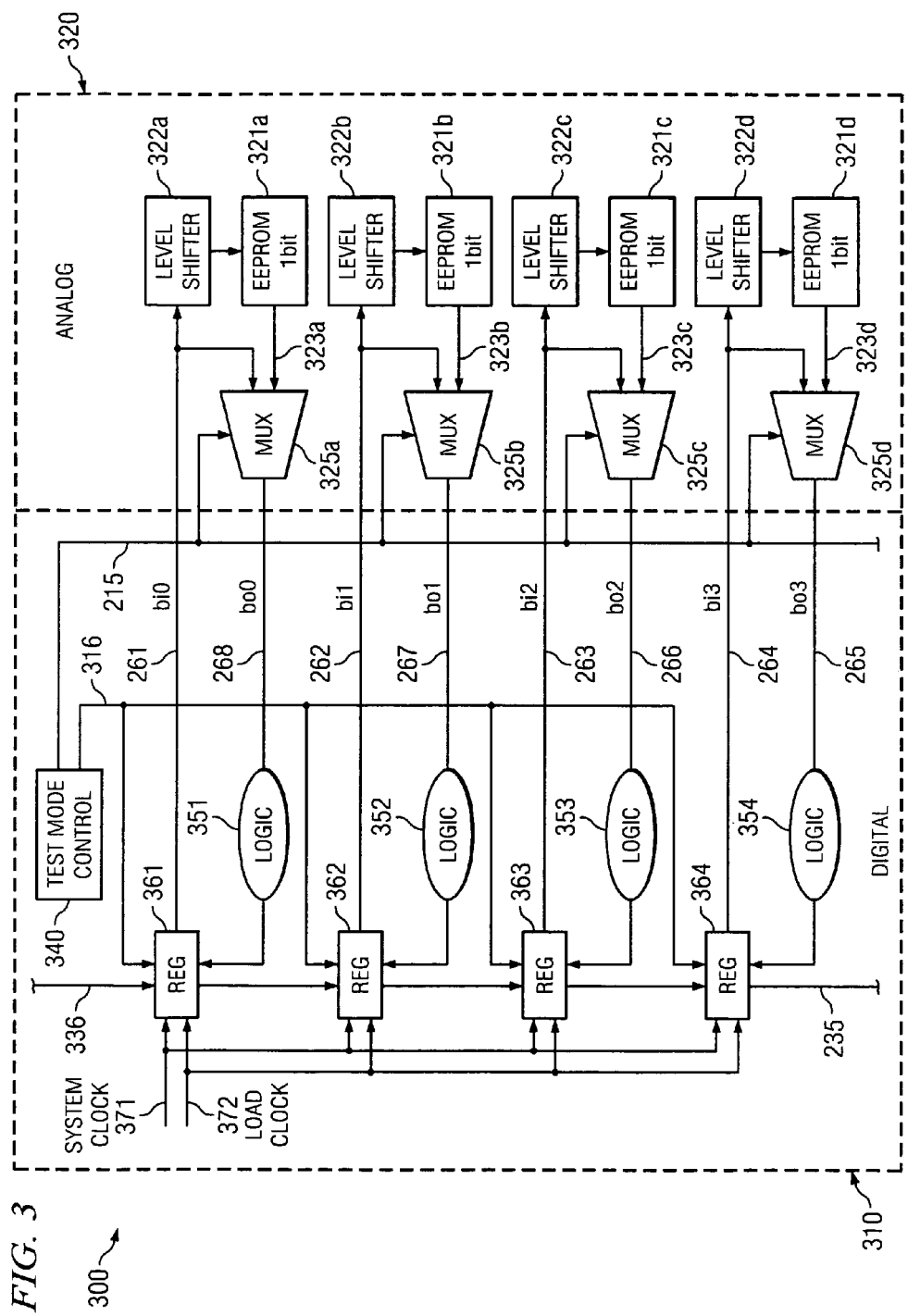
FIG. 3 is a schematic view of a mixed signal device designed for improved testability in accordance with other embodiments of the present invention.

Turning to FIG. 3, an exemplary mixed signal device 300 in accordance with various embodiments of the present invention is illustrated. Device 300 includes a digital portion 310 and an analog portion 320. As shown, digital portion 310 includes a test mode control 340 that is responsible for controlling when test mode or normal operation for mixed signal device 300 is selected. Test mode control 340 controls assertion of selector input 215 and selector 316. As more fully described below, selector input 215 and selector input 316 control muxes 325, and use of latching devices 361, 362, 363, 364. Based on the disclosure provided herein, one of ordinary skill in the art will recognize that in some cases selector input 215 and selector input 316 may be the same signal, or may be distinct signal depending upon the test processes to be implemented in relation to mixed signal device 300.

Test mode control 340 may be programmable via one or more methods as are known in the art. For example, test mode control 340 may be tied to an external pin of mixed signal device 300 that controls whether the device is operated in a test mode, or whether it is operated in a normal operational mode. Alternatively, mixed signal device 300 may include one or more registers that may be programmed with control words. Programming of a particular control word may cause test mode control 340 to switch operation of mixed signal device 300 between a normal operational mode and a test mode. Based on the disclosure provided herein, one of ordinary skill in the art will recognize a variety of implementations of test mode control 340 and/or various test and normal operational modes that may be designed and operated in relation to mixed signal device 300.

In addition, digital portion 310 includes a number of latch devices 361, 362, 363, 364. While only four latch devices are shown, one of ordinary skill in the art will recognize that any number of latch devices may be employed depending upon the design and/or die size of the semiconductor device implementing digital portion 310. Each of latch devices 361, 362, 363, 364 are associated with various logic 351, 352, 353, 354 that include elements used to implement the intended purpose of mixed signal device 300. For example, logic 351 may include, but is not limited to, combinatorial logic, a direct wired connection, a buffered connection, and/or the like. While logic 351, 352, 353, 354 is shown only in the path of output lines 265, 266, 267, 268, it should be recognized that logic 351, 352, 353, 354 may be included in either or both of input lines 261, 262, 263, 264 and output lines 265, 266, 267, 268 depending upon the design of digital portion 310. Further, logic 351, 352, 353, 354 may be implemented such that it affects the operation of digital portion 310 and/or analog portion 320 in one way when mixed signal device 300 is operated in a normal operational mode, and in another way when mixed signal device 300 is operated in a test mode. Based on the disclosure provided herein, one of ordinary skill in the art will recognize a variety of logic that may be employed in a design using latch devices 361, 362, 363, 364.

As shown, analog portion 320 includes a number of EEPROM cells 321 each driven by a level shifter 322. As will be appreciated by one of ordinary skill in the art, level shifters 322 facilitate the writing of EEPROM cells 321. Where, for example, other types of memory cells are used, level shifters 322 may not be required. A mux 325 is associated with each EEPROM cell 321 in analog portion

320. Using mux 325a as a representative example of the other muxes 325, mux 325a receives input line 261 from digital portion 310 and an EEPROM cell output 323a. Based on test input selector 215, mux 325a drives either EEPROM cell output 323a or data input line 261 onto data output line 268. This provides an ability to bypass EEPROM cells 321 which may take a significant amount of time to read and/or write when compared with the amount of time required to propagate through mux 325. It should be noted that any number of EEPROM cells, level shifters, and muxes may be implemented depending upon design requirements and die size. Thus, using four combinations of EEPROM cells, level shifters, and muxes is merely exemplary.

In normal operation of mixed signal device 300, latch devices 361, 362, 363, 364 are clocked using a system clock 371. As such, upon assertion of system clock 371, latch devices are able to drive latched or stored values through various logic including muxes 325, EEPROM cells 321 via level shifters 322, and/or logic 351, 352, 353, 354. Further, upon assertion of system clock 371, latch devices are able to capture data propagating through muxes 325, logic 351, 352, 353, 354, and/or from EEPROM cells 321. Based upon the disclosure provided herein, one of ordinary skill in the art will recognize the operation of such latch devices as they interact with a particular semiconductor design operating in a normal operational mode.

In contrast, when mixed signal device 300 is placed in test mode using test mode control 340, selector input 215 and/or selector 316 are selectively asserted. In some test modes, at least some of latch devices 361, 362, 363, 364 are arranged in a scan chain. The scan chain is assembled by driving the input of one of latch devices 361, 362, 363, 364 with the output of another of the latch devices. As such, a predetermined pattern may be loaded into the scan chain by serially applying the pattern to a scan chain input 336 (i.e., the input of the first latch device in the scan chain), and continually clocking each of latch devices 361, 362, 363, 364 in the scan chain with a load clock 372 until the pattern is loaded into latch devices 361, 362, 363, 364. With the pattern loaded into the scan chain, an element of the pattern is present on the output of each of latch devices 361, 362, 363, 364, and propagates to, among other places, analog portion 320. In analog portion 320, the pattern is either written to EEPROM cells 321 or propagated directly through muxes 325 depending upon the assertion level of selector input 215. The pattern then propagates through logic 351, 352, 353, 354 where it is presented to latch devices 361, 362, 363, 364. System clock 371 is then applied to latch devices 361, 362, 363, 364 which causes the derivative of the pattern to be captured in latch devices 361, 362, 363, 364. The scan chain is then clocked with load clock 372 which causes the derivative of the pattern to be presented in serial form on test output 235. System clock 371 and load clock 372 are selectively applied to latch devices 361, 362, 363, 364 based on the assertion level of selector 316.

Based on the disclosure provided herein, one of ordinary skill in the art will recognize other possible implementations in accordance with one or more embodiments of the present invention. For example, the various devices and/or connections disposed between the various registers, muxes and memory cells. As just some of many examples, there may be combinatorial logic and/or buffers implemented between register 361 and mux 325a, or there may be combinatorial logic, a buffer, one or more additional latches implemented between register 361 and register 362. It should thus be recognized that there may be many latches in digital portion 310 that may not be connected directly or indirectly to any memory cell. These additional registers may be part of a scan chain, or may not be part of any scan chain depending upon particular design requirements. Thus, it will be understood that various aspects of the present invention may be implemented in relation to various circuitry depending upon the particular design.

Figure 4:
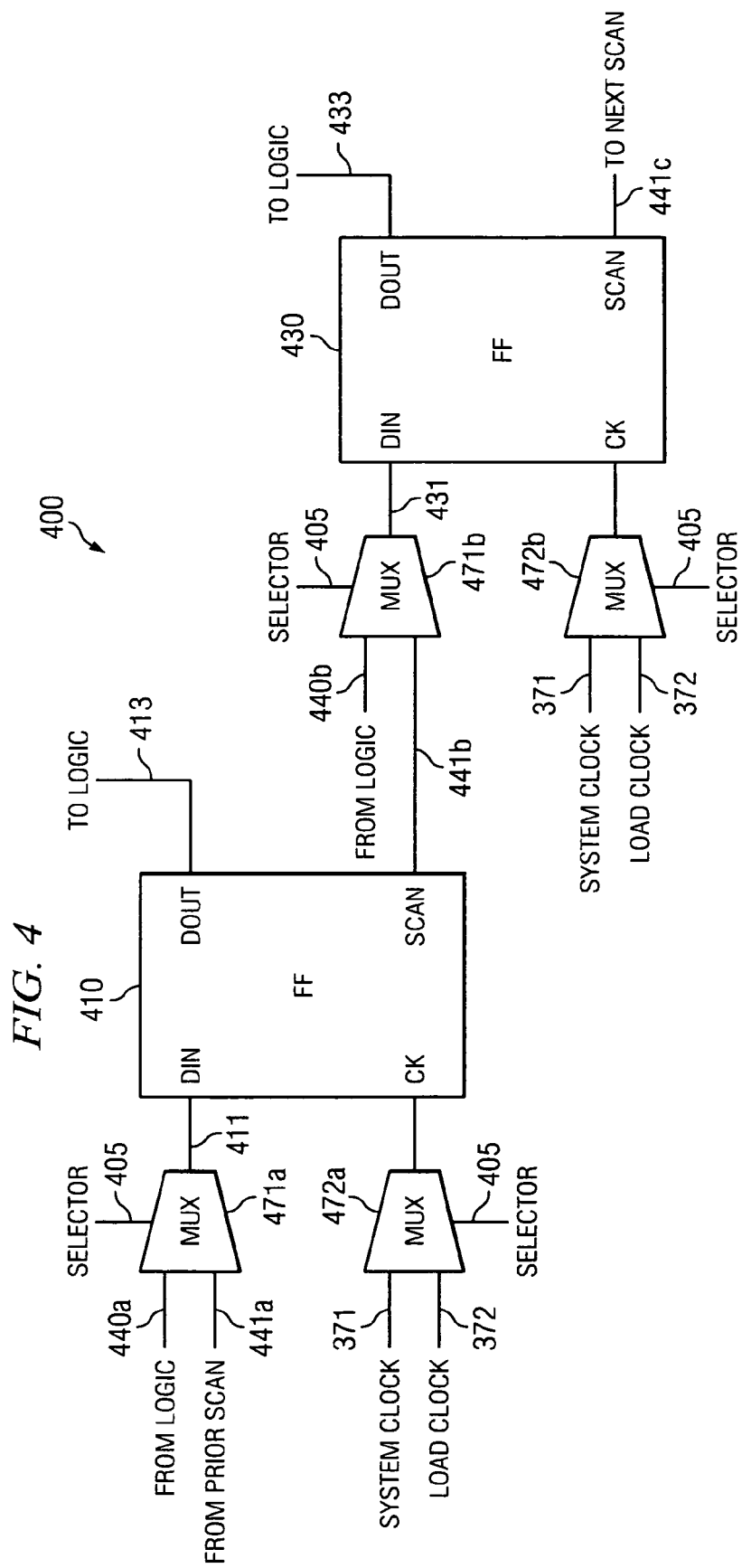
FIG. 4 is an exemplary scan chain approach that may be used in relation to the embodiments depicted in FIG. 2 and FIG. 3.

Turning to FIG. 4, an exemplary portion of a scan chain 400 is depicted that may be used in relation to system 200 and/or mixed signal device 300. Scan chain 400 includes two latch devices 410, 430 formed together as part of a chain. A selector 405 controls whether latch devices 410, 430 operate in a normal operation mode or in a scan chain as part of a test mode. In the normal operation mode, selector 405 is typically asserted at one level and logic 440 implemented as part of mixed signal device 300 drives an input 411, 431 of the respective latch devices 410, 430 via muxes 471. In this mode, latch devices 410, 430 receive and store data present at data inputs 411, 431 upon an edge of a system clock 371. Outputs 413, 433 from latch devices 410, 430 drive logic in the system.

Alternatively, in a test mode selector 405 is toggled between different assertion levels causing muxes 471 to select either logic 440 or a prior scan input 441 to drive inputs 411, 431 of latch devices 410, 430. Further, selector 405 selects either load clock 372 or system clock 371 to cause latching of data. For example, selector 405 may at first be asserted such that prior scan input 441 in the scan chain (e.g., latch device 410 is a prior to latch device 430 in scan chain 400) drives a later device in the scan chain to load a pattern to the scan chain. Load clock 372 is selected via mux 372 to synchronize the loading. Loading is accomplished by continually clocking latch devices in the scan chain with load clock 372 until a pattern presented at the first latch device in the scan chain serially provided is cascaded into the scan chain. This typically involves presenting a pattern with a number of bits equal to the number of latch devices in the scan chain, and clocking the scan chain with a number of clock edges equal to the number of latch devices in the scan chain.

With the pattern loaded into the scan chain, the output of latch devices 410, 430 propagates through logic 413, 433, and ultimately drives logic inputs 440. Selector 405 is then asserted such that logic inputs 440 are applied to the drive inputs 411, 431 of latch devices 410, 430 via muxes 471, and system clock 472 is applied to the clock input of latch devices 410, 430. As such, the value presented by logic 440 is latched into latch devices 410, 430 upon an edge of system clock 371. This latched value is a derivative of the pattern originally loaded into the scan chain.

The assertion level of selector 405 may then be switched so that prior scan input 441 drives inputs 411, 431 of the respective latch devices 410, 430, and load clock 372 is applied to the clock input 412, 432 of the respective latch devices 410, 430. Load clock 372 may then be toggled a number of times causing the derivative of the pattern to propagate through the scan chain and out a pattern output that is driven by the final latch device in the scan chain. In this way, the pattern output is a serial version of the derivative of the pattern.

Turning to FIG. 5, a flow diagram 500 illustrates a test method in accordance with one or more embodiments of the present invention. Following flow diagram 500, an initial pattern is provided to a scan chain input (block 503). This pattern may be any series of "1's" and "0's" designed to test certain aspects of a device such as mixed signal device 300 described in relation to FIG. 3 above. It should be noted that the initial pattern will typically include a number of bits equal to the number of latch devices in a scan chain implemented in the device under test. However, based on the disclosure provided herein, one of ordinary skill in the art will recognize that other pattern lengths may be used, and any combination of "1's" and "0's" may be used to form the pattern.

Selector 316 may then be asserted such that load clock 372 is applied to the latch devices in the scan chain. With the selectors thus asserted, load clock 372 is toggled a sufficient number of times to cause latch devices 361, 362, 363, 364 in the scan chain to be loaded with the initial pattern (block 530). As one example, where the pattern is four bits long and the scan chain includes four latch devices chained together, the load clock is toggled four times to effectuate loading of the scan chain. Where the scan chain is longer, a longer pattern is used along with a larger number of load clocks to load the scan chain. Based on the disclosure provided herein, one of ordinary skill in the art would be able to develop patterns and procedures for loading patterns that would be suitable for a particular design. In addition, test input selector 215 may be asserted to bypass EEPROM cells 321 in the analog portion of the device using muxes 325 associated therewith (block 509).

With the pattern loaded in the scan chain (block 506) and the muxes selected to bypass EEPROM cells 321 (block 509), the output from the various latch devices in the scan chain propagates through logic in the system and drives the inputs of the scan chain. Selector 316 is then toggled such that the scan chain is driven by the derivative of the pattern and clocked by system clock 371. The scan chain is then clocked one time with system clock 371 such that the derivative of the pattern is stored in the latch devices of the scan chain (block 512). With the derivative of the pattern captured in the scan chain, selector 316 is toggled such that the input for each latch device in the scan chain is the output of the prior latch device in the scan chain, and the latch devices in the scan chain are clocked with load clock 372. This results in a test output driven by the last latch device in the scan chain providing a serial output of the derivative of the pattern (block 515).

The test output may be analyzed (block 518) to determine whether the device under test functioned as desired (block 521). This analysis may include, for example, comparing the captured test results against a known device functionality. Any deviation may be used to simply reject the device under test, or may additionally be used to determine an exact failure and possible design improvement to improve yield. Where the analysis indicates that the device is not good (block 521), the device is rejected (block 524). Because the derivative of the pattern may be captured without requiring a write and/or read of EEPROM cells 321, the test can be accomplished quickly compared to a test where an EEPROM access is required. In some cases, the time required for the pattern to propagate through the logic and return to the latch devices is less than a clock cycle of the system clock. Thus, this approach provides a very efficient method for testing a device.

Alternatively, where the device passes the test (block 521), it is determined whether all of the desired patterns have been applied in testing the device (block 527). Where other patterns remain (block 527), another pattern is applied (block 530) and the processes of blocks 506-527 repeated. Once the desired patterns have been processed (block 527), EEPROM cells can be tested. This involves loading a pattern into the scan chain as described in relation to block 506 (block 533). This pattern is typically an alternating bit pattern such as a "0101" pattern. A standard EEPROM write is then effectuated that writes the pattern to the appropriate EEPROM cells (block 536). The EEPROM is then read using a standard read, and the output of the EEPROM is captured in the scan chain using system clock 371 (block 539). The captured results may then be clocked out of the scan chain as described in relation to block 515, and analyzed (block 542).

Where the analysis indicates a failure of one or more of EEPROM cells 321 (block 545), the device is rejected (block 524). Otherwise, the scan chain is loaded with another pattern such as a reversed alternating pattern (i.e., "1010") (block 548). The pattern is then written to and read from the EEPROM (blocks 551, 552), and the results analyzed (block 557). Where the analysis indicates that the device is not functioning properly (block 560), the device is rejected (block 524). Otherwise, the device is accepted (block 563).

The invention has now been described in detail for purposes of clarity and understanding. However, it will be appreciated that certain changes and modifications may be practiced within the scope of the appended claims. For example, the disclosure has focused on using embodiments of the present invention for testability purposes, but it should be recognized that one or more embodiments of the present invention may be used in relation to standard operating modes. Thus, although the invention is described with reference to specific embodiments and figures thereof, the embodiments and figures are merely illustrative, and not limiting of the invention. Rather, the scope of the invention is to be determined solely by the appended claims.

What is claimed is:

1. A method for testing a device including a nonvolatile memory cell, the method comprising:

providing a device with a digital portion and an analog portion;

wherein the digital portion includes:

a plurality of latch devices;

wherein the analog portion includes:

a plurality of memory cells;

a plurality of selector devices, wherein each of the plurality of selector devices is electrically coupled to a respective one of the nonvolatile memory cells; wherein each of the plurality selector devices is at least indirectly coupled to one of the plurality of latch devices; and wherein at least one of the plurality of selector devices is controlled by a selector input;

applying a load clock to the plurality of latch devices, wherein a pattern is loaded into the plurality of latch devices;

driving inputs of the nonvolatile memory cells with the pattern;

driving the selector input to receive a derivative of the pattern from the inputs of the nonvolatile memory cells by the plurality of selectors, and the derivative of the pattern is returned to at least a subset of the plurality of latch devices; and applying a system clock to the plurality of latch devices, wherein the derivative of the pattern is loaded into the plurality of latch devices.

2. The method of claim 1, wherein the method further comprises:

applying the load clock to the plurality of latch devices, wherein the derivative of the pattern is provided by the plurality of latch devices to a output.

3. The method of claim 1, wherein the plurality of latch devices are formed in a scan chain, and wherein applying the load clock to the plurality of latch devices whereby the pattern is loaded into the plurality of latch devices includes providing multiple cycles of the load clock to the scan chain.

4. The method of claim 3, wherein the method further comprises:
applying the load clock to the plurality of latch devices in the scan chain, wherein the derivative of the pattern is provided by the plurality of latch devices to a output; and
wherein providing the derivative of the pattern from the plurality of latch devices to the output includes providing multiple cycles of the load clock to the scan chain.

5. The method of claim 1, wherein the system clock is applied to the plurality of latch devices when the selector input is at a first level, and wherein the load clock is applied to the plurality of latch devices when the selector input is at a second level.

6. The method of claim 1, wherein the pattern is a first pattern, wherein the derivative of the pattern is a first derivative of the pattern, the method further comprising:
applying the load clock to the plurality of latch devices, wherein a second pattern is loaded into the plurality of latch devices;
driving the selector input whereby a derivative of the pattern is written to at least a portion of the memory cells; and
applying the system clock to the plurality of latch devices, wherein a derivative of the second pattern is loaded from the portion of the memory cells to the plurality of latch devices.

7. The method of claim 6, wherein the plurality of latch devices are formed in a scan chain, and wherein applying the load clock to the plurality of latch devices to load the first pattern into the plurality of latch devices providing multiple cycles of the load clock to the scan chain, and wherein applying the load clock to the plurality of latch devices to load the second pattern into the plurality of latch devices providing multiple cycles of the load clock to the scan chain.

8. The method of claim 7, wherein the method further comprises:
applying a system clock to the plurality of latch devices in the scan chain, wherein the derivative of the second pattern is provided by the plurality of latch devices to a output; and
wherein providing the derivative of the second pattern from the plurality of latch devices to the output includes providing multiple cycles of the system clock to the scan chain.

9. A system for facilitating efficient semiconductor device testing, the system comprising:
a mixed signal device, wherein the mixed signal device includes an analog portion and a digital portion;
wherein the analog portion includes a plurality of nonvolatile memory cells each associated with a respective selector device, wherein the plurality of nonvolatile memory cells and the associated selector devices are accessible via the digital portion, and wherein the respective selector device is operable to bypass the associated nonvolatile memory cell; and
wherein the digital portion includes a plurality of latch devices coupled to one or more of the selector devices; and
wherein the digital portion is clocked using a system clock, wherein the respective selector device is controlled via a selector input, and wherein data provided by the digital portion is applied to the inputs of the nonvolatile memory cells and bypassed by the selector devices whereby the data is returned to the digital portion within a cycle of the system clock when the selector input is at a particular level.

10. The system of claim 9, wherein the selector devices are muxes.

11. The system of claim 9, wherein the plurality of latch devices are formed in a scan chain.

12. The system of claim 11, wherein the scan chain is loaded with a pattern using a load clock, and wherein a derivative of the pattern is latched from the plurality of selector devices using a system clock.

13. The system of claim 9, wherein the respective selector device is a mux controlled via a selector input, and wherein data provided to the mux from the digital portion is written to the associated memory cell when the selector input is at a particular level.

14. The system of claim 9, wherein the memory cells are selected from a group consisting of: EEPROM cells and EPROM cells.

* * * * *